(12) United States Patent
Losee et al.

(10) Patent No.: US 11,031,472 B2
(45) Date of Patent: Jun. 8, 2021

(54) SYSTEMS AND METHODS FOR INTEGRATED DIODE FIELD-EFFECT TRANSISTOR SEMICONDUCTOR DEVICES

(71) Applicant: General Electric Company, Schenectady, NY (US)

(72) Inventors: Peter Almern Losee, Clifton Park, NY (US); Reza Ghandi, Niskayuna, NY (US); Alexander Viktorovich Bolotnikov, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 16/282,145

(22) Filed: Feb. 21, 2019

(65) Prior Publication Data
US 2020/0212182 A1    Jul. 2, 2020

Related U.S. Application Data

(60) Provisional application No. 62/786,001, filed on Dec. 28, 2018.

(51) Int. Cl.
*H01L 29/15* (2006.01)
*H01L 29/16* (2006.01)
(Continued)

(52) U.S. Cl.
CPC ...... *H01L 29/1608* (2013.01); *H01L 29/0634* (2013.01); *H01L 29/66712* (2013.01); *H01L 29/781* (2013.01); *H01L 29/7806* (2013.01)

(58) Field of Classification Search
CPC ............ H01L 29/1608; H01L 29/0634; H01L 29/781; H01L 29/7806; H01L 29/66712; H01L 29/0619; H01L 29/872
See application file for complete search history.

(56) References Cited

U.S. PATENT DOCUMENTS

| 5,665,993 A | 9/1997 | Keller et al. |
| 6,979,863 B2 | 12/2005 | Ryu |

(Continued)

FOREIGN PATENT DOCUMENTS

| CN | 102610523 B | 2/2015 |
| JP | 2003017701 A | 1/2003 |

(Continued)

OTHER PUBLICATIONS

Chimento, F., et al.; "Super-Junction MOSFET and SiC Diode Application for the Efficiency Improvement in a Boost PFC Converter", IECON 2006—32nd Annual Conference on IEEE Industrial Electronics; pp. 2067-2072.

(Continued)

*Primary Examiner* — Robert G Bachner
(74) *Attorney, Agent, or Firm* — Fletcher Yoder, P.C.

(57) ABSTRACT

A silicon carbide (SiC) semiconductor device may include a CB layer defined in a first epitaxial (epi) layer having a first conductivity type. The CB layer may include a plurality of CB regions having a second conductivity type. The SiC semiconductor device may further include a device epi layer having the first conductivity type disposed on the CB layer. The device epi layer may include a plurality of regions having the second conductivity type. Additionally, the SiC semiconductor device may include an ohmic contact disposed on the device epi layer and a rectifying contact disposed on the device epi layer. A field-effect transistor (FET) of the device may include the ohmic contact, and a diode of the device may include the rectifying contact, where the diode and the FET are integrated in the device.

21 Claims, 8 Drawing Sheets

(51) Int. Cl.
  *H01L 29/06* (2006.01)
  *H01L 29/78* (2006.01)
  *H01L 29/66* (2006.01)

(56) References Cited

U.S. PATENT DOCUMENTS

| | | |
|---|---|---|
| 7,416,929 B2 | 8/2008 | Mazzola et al. |
| 7,713,822 B2 | 11/2010 | Thorup et al. |
| 8,518,777 B2 | 8/2013 | Shenoy |
| 8,669,614 B2 | 3/2014 | Cheng |
| 9,099,320 B2 | 8/2015 | Hsieh |
| 9,368,587 B2 | 6/2016 | Kocon et al. |
| 9,391,190 B2 | 7/2016 | Watanabe et al. |
| 9,735,237 B2 | 8/2017 | Losee et al. |
| 9,780,086 B2 | 10/2017 | Guitart et al. |
| 10,243,039 B2 | 3/2019 | Bolotnikov et al. |
| 10,541,338 B2 | 1/2020 | Bolotnikov et al. |
| 2008/0150020 A1 | 6/2008 | Challa et al. |
| 2013/0313570 A1 | 11/2013 | Sdrulla et al. |
| 2017/0278924 A1* | 9/2017 | Bolotnikov ............ H01L 29/73 |

FOREIGN PATENT DOCUMENTS

| | | |
|---|---|---|
| KR | 1020090003306 A | 1/2009 |
| WO | 2017105414 | 6/2017 |
| WO | 2019073776 A1 | 4/2019 |

OTHER PUBLICATIONS

Choi, Won-suk, et al.; "Effectiveness of a SiC Schottky Diode for Super-Junction MOSFETs on Continuous Conduction Mode PFC", International Symposium on Power Electronics, Electrical Drives, Automation and Motion, 2010, p. 562-567.

PCT/US2019/068607; International Search Report and Written Opinion dated May 7, 2020; 16 pages.

Saito et al., "A Novel Low On-Resistance Schottky-barrier Diode with P-Buried Floating Layer Structure," IEEE Transactions on Electron Devices, (May 2004), 6 pages.

Dai et al., "SiC Power MOSFET with Monolithically Integrated Schottky Barrier Diode for Improved Switching Performances," PCIM Europe (May 2017), 4 pages.

* cited by examiner

SYSTEMS AND METHODS FOR INTEGRATED DIODE FIELD-EFFECT TRANSISTOR SEMICONDUCTOR DEVICES

CROSS-REFERENCE TO RELATED APPLICATION

This application claims priority to and the benefit of provisional Patent Application No. 62/786,001, entitled "SYSTEMS AND METHODS FOR INTEGRATED DIODE FIELD-EFFECT TRANSISTOR SEMICONDUCTOR DEVICES", filed Dec. 28, 2018, which is herein incorporated by reference in its entirety.

BACKGROUND

The subject matter disclosed herein relates to semiconductor devices and, more specifically, to field-effect transistor (FET) semiconductor power devices with integrated diodes.

For FET semiconductor power modules, co-packaging a FET device with a diode, such as a Schottky barrier diode, may offer certain advantages. For example, packaging the FET device with the diode may facilitate FET operation with a reduced forward voltage drop and/or a softer (e.g., lower) reverse recovery than traditional power module designs. For FET semiconductor power modules, integration of a diode, such as a Schottky barrier diode, with a FET device may also offer certain advantages. In such designs, the FET device and the diode use common conduction paths. As a result, the channel density of the FET device and/or the power module may be increased compared to power module designs that omit a diode and/or that include a discrete diode.

BRIEF DESCRIPTION

In one embodiment, a silicon carbide (SiC) semiconductor device includes a CB layer defined in a first epitaxial (epi) layer having a first conductivity type. The CB layer includes a plurality of CB regions having a second conductivity type. The SiC semiconductor device further includes a device epi layer disposed on the CB layer. The device epi layer has the first conductivity type and includes a plurality of regions having the second conductivity type. Additionally, the SiC semiconductor device includes an ohmic contact disposed on the device epi layer and a rectifying contact disposed on the device epi layer. A field-effect transistor (FET) of the SiC semiconductor device includes the ohmic contact, and a diode of the SiC semiconductor device includes the rectifying contact. The diode and the FET are integrated in the SiC semiconductor device.

In another embodiment, a method of manufacturing a silicon carbide (SiC) semiconductor device, involves: forming a first epitaxial (epi) layer having a first conductivity type on an underlying layer. The underlying layer is formed from wide-bandgap material. The method further includes implanting a first plurality of CB regions having a second conductivity type into the first epi layer to yield a CB layer and forming a device epi layer having a first conductivity type on the CB layer. The device epi layer includes a plurality of regions having the second conductivity type. Additionally, the method involves forming an ohmic contact on the device epi layer. A field-effect transistor (FET) of the SiC semiconductor device includes the ohmic contact. The method also involves forming a rectifying contact on the device epi layer. A diode of the SiC semiconductor device includes the rectifying contact, and the diode and the FET are integrated in the SiC semiconductor device.

In another embodiment a silicon carbide (SiC) semiconductor device includes a CB layer defined in a first epitaxial (epi) layer having a first conductivity type. The CB layer includes a plurality of CB regions having a second conductivity type. The SiC semiconductor device also includes a device epi layer having the first conductivity type disposed on the CB layer. The device epi layer includes a plurality of junction barrier Schottky (JBS) regions having the second conductivity type. Further, the SiC semiconductor device includes an ohmic contact disposed on the device epi layer. A field-effect transistor (FET) of the SiC semiconductor device includes the ohmic contact. Additionally, the SiC semiconductor device includes a rectifying contact disposed on the device epi layer. The rectifying contact is disposed on a JBS region of the plurality of JBS regions. Further, a diode of the SiC semiconductor device includes the rectifying contact. The diode and the FET are integrated in the SiC semiconductor device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
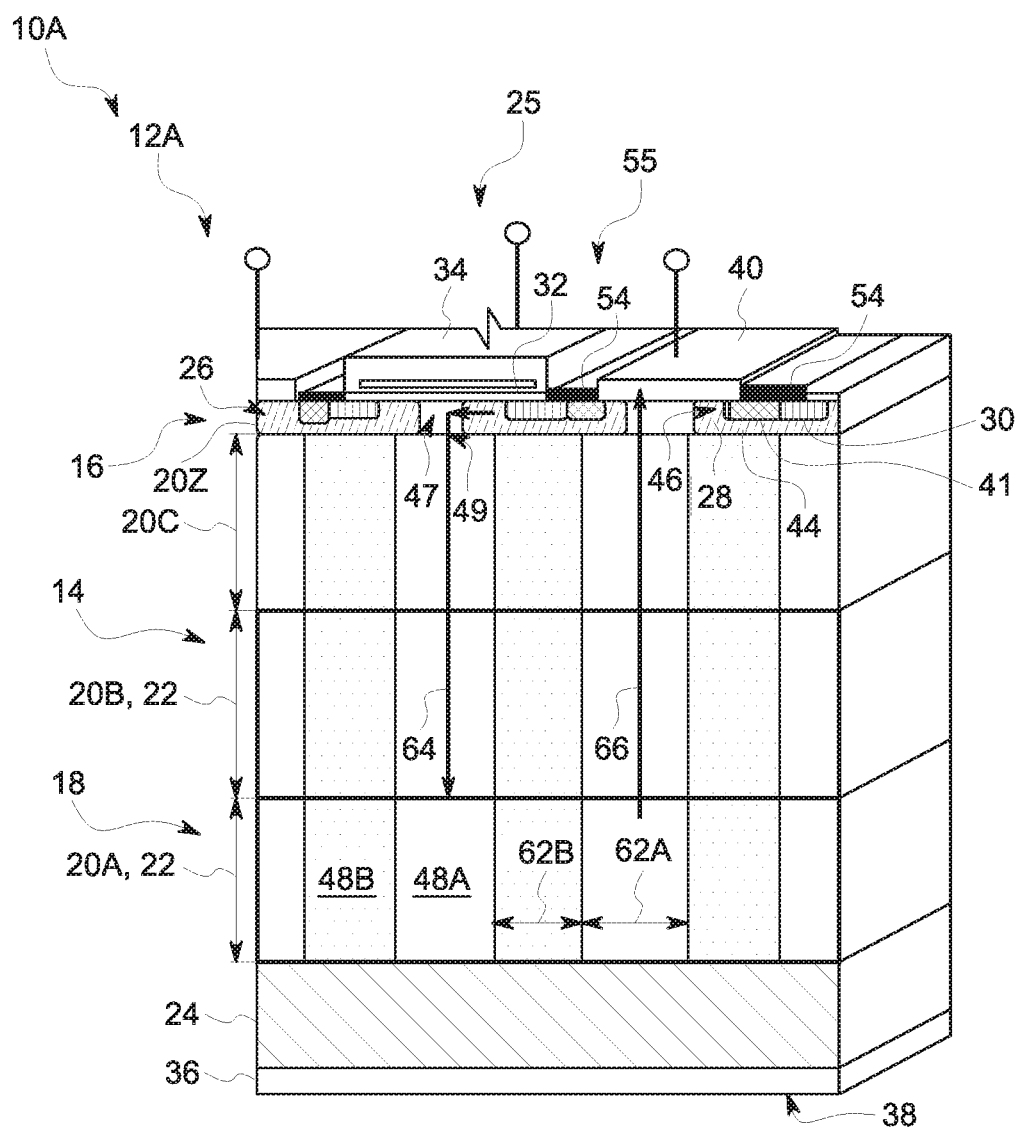
FIG. 1 is a cross-sectional view of a super-junction (SJ) semiconductor device that includes a diode integrated with a field-effect transistor (FET), as well as a SJ region having a set of SJ pillars, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. Accordingly, the term "disposed directly on" as used herein means that the two layers are directly in contact with each other with no intervening layers there between. The term "adjacent" as used herein means that the two layers and/or two features (e.g., implanted regions) are disposed contiguously and are in direct contact with each other.

In the present disclosure, when a layer/region is being described as "on" another layer or substrate, it is to be understood that the layers/regions can either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "directly above" and "directly below" describe the relative position of layers/regions directly in contact with each other with no intervening layers there between. Further, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively distant from the substrate layer.

Present embodiments are directed toward designs and methods for manufacturing integrated diode field-effect transistor (ID-FET) semiconductor device designs, such as super-junction (SJ) ID-FET devices and/or charge balance (CB) ID-FET devices. The disclosed designs and methods are useful in the manufacture of FETs, such as metal-oxide semiconductor field-effect transistors (MOSFETs), junction field-effect transistors (JFETs), metal-semiconductor field-effect transistors (MESFETs), and/or the like, having an integrated diode, such as a Schottky diode, a junction barrier Schottky (JBS) diode, merged PiN Schottky (MPS) diodes, and/or the like. More specifically, the disclosed designs and methods are useful in the manufacture of CB and/or SJ FETs having integrated CB and/or SJ diodes, respectively. Accordingly the disclosed designs and methods are also useful for medium-voltage (e.g., 3 kV-10 kV), such as 3.3 kV-6.5 kV, and/or high-voltage (e.g., greater than 10 kV) power conversion related applications, as well as for medium-voltage and/or high-voltage power conversion related applications. While the following discussion relates to silicon carbide (SiC) devices, the disclosed designs and methods may be used with any suitable semiconductor materials, such as silicon (Si), gallium nitride, diamond, aluminum nitride, boron nitride, for example.

As discussed in greater detail below, a diode, such as a Schottky diode, may be integrated in parallel with a SJ or a CB FET, and/or a FET may be integrated in parallel with a SJ and/or CB diode. As described herein, integrating the diode and the FET in "parallel" refers to integrating the diode and FET electrically parallel such that the same drift region (e.g., conduction path) is used during operation of the FET and operation of the diode. Further, a SJ semiconductor device includes SJ pillars having opposite conductivity type (e.g., p-type pillars) compared to the remainder of the drift region of the device. Accordingly, in some embodiments, the SJ semiconductor device may include a current spreading layer, such as an additional epi layer or implanted layer disposed above an SJ region that is disposed within the drift region, to enhance conduction for the FET and the diode.

Additionally or alternatively, a diode and a FET may be integrated within a CB semiconductor device to produce a CB integrated diode field-effect transistor (CBID-FET) device. In such embodiments, the area consumed by a power module implemented with the CBID-FET device may be reduced in comparison with the total area consumed by a discrete FET and a discrete diode. Moreover, the CBID-FET device may benefit from reverse conduction with low conduction loss and soft recovery characteristics. For example, the integrated diode of the CBID-FET device may suppress the operation of an internal PN-junction body diode intrinsic to the FET.

With the foregoing in mind, FIG. 1 illustrates a cross-sectional view of an embodiment of an integrated diode (ID) field-effect transistor (FET) semiconductor device 10A, such as a super-junction (SJ) integrated diode (ID) field-effect transistor (FET) device 12A. In some embodiments, the SJID-FET device 12A includes a drift region 14 that includes a device layer 16 disposed on an SJ region 18. It may be appreciated that, in order to more clearly illustrate certain components of the SJID-FET device 12, as well as other devices discussed below, certain commonly understood design elements (e.g., top metallization, passivation, edge termination, and so forth) may be omitted.

The drift region 14 of the ID-FET semiconductor device 10 illustrated in FIG. 1 includes a number of epitaxial layers 20 having a first conductivity type (e.g., n-type epi layers 20) that form the device layer 16 and the SJ region 18 of the ID-FET semiconductor device 10. Additionally, the epi layers 20 each have a dopant concentration, which may be the same or different, in certain embodiments. For instance, one or both of the epi layers 20 may have an epi dopant concentration approximately less than $5 \times 10^{15}$ per centimeter cubed ($cm^{-3}$) and/or approximately greater than or equal to $1\times10^{14}$ cm$^{-3}$. Further, while the illustrated embodiment includes four epi layers 20 (e.g., 20A, 20B, 20C, and 20Z), the ID-FET semiconductor device 10 may include any suitable number of epi layers 20 (e.g., 3, 4, 5, 6, or more), including one or more SJ layers 22, to yield a SJID-FET device 12 having a particular desired voltage rating. In some embodiments, the epi layers 20 may be formed from one or more semiconductor materials, such as silicon or wide-bandgap materials (e.g., silicon carbide, gallium nitride, diamond, aluminum nitride, and/or boron nitride). The epi layers 20 may be fabricated using repeated cycles of epitaxial overgrowth. As illustrated, the first epi layer 20A is disposed directly on a substrate layer 24 having the first conductivity type, the second epi layer 20B is disposed directly on the first epi layer 20A, the third epi layer 20C is disposed directly on the second epi layer 20B, and the device epi layer 20Z is disposed directly on the third epi layer 20C. In other embodiments, the ID-FET semiconductor device 10 may include additional epi layers 20 (e.g., 20D, 20E and so forth) intervening between the first epi layer 20A and the device epi layer 20Z, where each of the lower or buried epi layers are also SJ layers 22.

The field-effect transistor (FET) area 25 of the ID-FET semiconductor device 10 may include well regions 28 having a second conductivity type (e.g., p-type well regions 28) disposed adjacent to a source region 30 having the first conductivity type (e.g., n-type source region 30) at a top surface 26 of the device layer 16. In the illustrated embodiment, a dielectric layer 32 (also referred to as a gate insulating layer or gate dielectric layer) is disposed adjacent to the device layer 16, and a gate electrode 34 is disposed adjacent to the dielectric layer 32. Further, the SJ region 18 is disposed on a substrate layer 24 (e.g., a semiconductor substrate layer, a wide-bandgap substrate layer), and a drain contact 36 is disposed on the bottom 38 of the ID-FET semiconductor device 10, adjacent to the substrate layer 24. Additionally, a source contact 40 is disposed adjacent to the top surface 26 of the device layer 16, and is disposed on a portion of both the source region 30 and the well region 28 of the device layer 16. For clarity, the portion of the source region 30 (e.g., n-type source region 30) of the ID-FET semiconductor device 10 disposed below the source contact 40 may be more specifically referred to herein as a source contact region 41 of the ID-FET semiconductor device 10. Similarly, a portion of the well region 28 (e.g., p-type well region 28) of the ID-FET semiconductor device 10 may be more specifically referred to herein as a body region 44 (e.g., p+ body region 44) of the ID-FET semiconductor device 10. Additionally, the portion of the body region 44 that is disposed below and adjacent to (e.g., covered by, directly electrically connected to) the source contact 40, may be more specifically referred to herein as a body contact region 46 (e.g., p+ body contact region 46) of the ID-FET semiconductor device 10.

During on-state operation of the FET area 25 of the ID-FET semiconductor device 10, an appropriate gate voltage (e.g., at or above a threshold voltage ($V_{TH}$) of the ID-FET semiconductor device 10) causes an inversion layer to be formed in a channel region 47, as well as a conductive path to be enhanced in a junction field-effect transistor (JFET) region 49 due to accumulation of carriers. As such, current flows from the drain contact 36 (e.g., drain electrode, drain terminal) to the source contact 40 (e.g., source electrode, source terminal). It may be noted that the channel region 47 may be generally defined as an upper portion of the well region 28 disposed below the gate electrode 34 and the dielectric layer 32.

To reduce on-state resistance (Rds(on)) and resultant on-state conduction losses, the embodiment of the ID-FET semiconductor device 10A illustrated in FIG. 1 includes a SJ region 18, which may include any suitable number of SJ layers 22. Each of the SJ layers 22 includes a first set of SJ pillars 48A oppositely doped relative to a second set of SJ pillars 48B. In other words, the first set of SJ pillars 48A have a first conductivity type (e.g., n-type SJ pillars 48), while the second set of SJ pillars 48B have a second conductivity type (e.g., p-type SJ pillars 48). In some embodiments, the first set of SJ pillars 48A may be doped with nitrogen, phosphorous, or another suitable n-type dopants, while the second set of SJ pillars 48B are doped with boron, aluminum, or another suitable p-type dopant, or vice versa.

Further, the dopant concentration in the first set of SJ pillars 48A and in the second set of SJ pillars 48B of the SJ region 18 is approximately the same (e.g., ±3%, ±2%, ±1%). For example, in some embodiments, each of the first set of SJ pillars 48A and each of the second set of SJ pillars 48B may have a dopant concentration greater than $5\times10^{15}$ cm$^{-3}$ and/or less than $1\times10^{17}$ cm$^{-3}$. In some embodiments, the first set of SJ pillars 48A and the second set of SJ pillars 48B are each generally designed to substantially deplete and to generally provide similar amounts (e.g., substantially equal amounts) of effective charge (e.g., per cm$^2$, normalized to device active area) from ionized dopants under reverse bias. Accordingly, the illustrated super-junction structure allows the ID-FET semiconductor device 10 to achieve high blocking voltage and/or breakdown voltage, since the p-type semiconductor portions and the n-type semiconductor portions are both substantially depleted under nominal blocking conditions. It may be appreciated that, in other embodiments, the device layer 16 may include other implanted features (e.g., features particular to other device structures/types), in accordance with the present disclosure.

Fabricating continuous, vertical SJ pillars 48 that extend through the thickness of one or more epi layers 20 may be challenging for certain semiconductor materials having low diffusion coefficients of dopants. For example, fabricating such SJ pillars 48 may be challenging for embodiments in which the epi layers 20 are fabricated from SiC, which has lower diffusion coefficients for dopants compared to silicon (Si). For example, in order to form SJ pillars 48 that, at least in some cases, extend through the entire thickness of one or more epi layers 20, as present in a full SJ device, numerous (e.g., 10+) thin epitaxial growth/shallow ion implantation steps may be performed. Moreover, a combination of low energy implantation (e.g., implant acceleration energies less than 0.5 mega-electron volts (MeV)) and high energy implantation (e.g., implant acceleration energies greater than 0.5 MeV) may be used to implant the SJ pillars 48. For example, implant acceleration energies greater than 0.1 MeV and/or less than 50 MeV may be used. For instance, in some embodiments, an implant acceleration energy between 0.1 MeV and 30 MeV may be employed. Accordingly, the projected range (e.g., the penetration depth) of most commonly used SiC dopants (e.g., boron, nitrogen, phosphorus, aluminum) is approximately between 5 microns (μm) and 15 μm, which is at least suitable for implantation of the SJ pillars 48 through epi layers 20 having a thickness between 10 μm and 12 μm. Further, in some embodiments, a suitable high energy masking material (e.g., silicon on insulator (SOI), polysilicon, thick silicon oxide, high-Z metals such as platinum, molybdenum, gold) may be employed during the implantation of the SJ pillars 48, as described in greater detail below.

Further, in some embodiments, the ID-FET semiconductor device 10 includes a Schottky contact 54 (e.g., a rectifying contact and/or a Schottky barrier) disposed above and adjacent to the device epi layer 20Z. The Schottky contact 54 forms a Schottky barrier with the device epi layer 20Z at the junction of the device epi layer 20Z and the Schottky contact 54, as described in greater detail below. Moreover, the drain contact 36 may also function as a cathode terminal of the diode. Accordingly, as illustrated, the ID-FET semiconductor device 10 includes a diode (e.g., a Schottky barrier diode) integrated in the ID-FET semiconductor device 10 with a FET. More specifically, during the on-state operation of the FET area 25 of the ID-FET semiconductor device 10 described above (e.g., at a gate voltage at or above a threshold voltage ($V_{TH}$) of the ID-FET semiconductor device 10), the ID-FET semiconductor device 10 may demonstrate the operating characteristics of a FET. As such, current flows from the drain contact 36 to the source contact 40 within the portion of the SJ region 18 having the first conductivity type (e.g., the first set of SJ pillars 48A). Further, under certain operating conditions (e.g., diode operating conditions), the ID-FET semiconductor device 10 may demonstrate the operating characteristics of a diode. For example, when a reverse bias is supplied to the ID-FET semiconductor device 10, current may flow from the Schottky contact 54 to the drain contact 36. Moreover, under other operating conditions, such as when a voltage greater than the threshold voltage ($V_{TH}$) is applied to the gate electrode 34 and a turn-on voltage is applied to the drain contact 36, both the FET area 25 and the diode area 55 of the ID-FET semiconductor device 10 may be on. In such cases, however, current may flow in opposite directions through the FET area 25 of the ID-FET semiconductor device 10 compared to conventional FET conduction.

While the diode integrated in the ID-FET semiconductor device 10 is described herein as a Schottky diode (e.g., Schottky barrier diode), the ID-FET semiconductor device 10 may additionally or alternatively integrate other diodes, such as a junction barrier Schottky (JBS) diode and/or a merged PiN Schottky (MPS) diodes, as well as other diodes that may be useful for medium-voltage (e.g., 3 kV-10 kV) and high-voltage (e.g., greater than 10 kV) power conversion related applications. That is, embodiments described herein are intended to be illustrative and not limiting.

Figure 2:
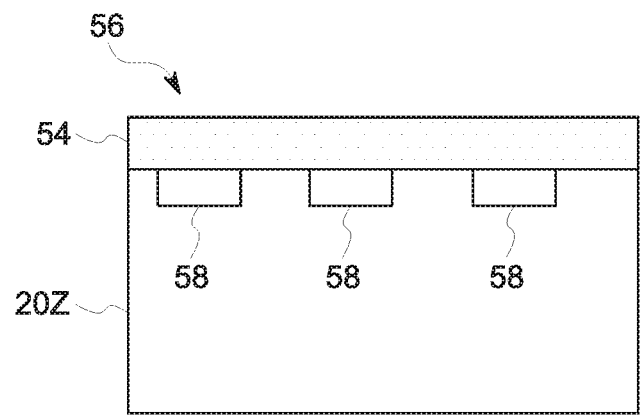
FIG. 2 is a cross-sectional view of a junction barrier Schottky (JBS) diode, in accordance with an embodiment.

To help illustrate, an embodiment of a JBS diode 56 is shown in FIG. 2. As illustrated, the JBS diode 56 includes a Schottky contact 54 formed on and electrically coupled to a set of JBS regions 58 implanted in an epi layer 20 (e.g., device epi layer 20Z). In some embodiments, the implanted set of JBS regions 58 are oppositely doped relative to the epi layer 20. In other words, for ID-FET semiconductor devices 10 having n-type epi layers 20, the JBS regions 58 are p-type, and for ID-FET semiconductor devices 10 having p-type epi layers 20, the JBS regions 58 are n-type. Accordingly, the implanted JBS regions 58 may block current flow, which may result in an ID-FET semiconductor device 10 having lower leakage current than an ID-FET semiconductor device 10 having only a Schottky contact 54 (e.g., a Schottky barrier diode).

Turning back to FIG. 1, in some silicon carbide (SiC) FET designs, increased channel density is desirable to facilitate low on-resistance. Accordingly, these designs may include small (e.g., 5 microns (μm) to 10 μm) FET cells (e.g., widths), which may encompass the width of the well region 28 and the JFET region 49. However, in some embodiments, the FET cell width may be approximately equal to the sum of the width 62A of the first set of SJ pillars 48A and the width 62B of the second set of SJ pillars 48B, and fabricating the first set of SJ pillars 48A and/or the second set of SJ pillars 48B with a width 62 (e.g., 62A and 62B, respectively) less than 5 μm may be challenging.

Further, in the illustrated ID-FET semiconductor device 10A, the FET area 25 and the diode area 55 are integrated, as mentioned above. Accordingly, the FET area 25 and the diode area 55 of the ID-FET semiconductor device 10 share current flow paths during their respective operations. For example, the first arrow 64 illustrates the current flow path of the FET area 25 of the ID-FET semiconductor device during FET operation, while the second arrow 66 illustrates the current flow path of the diode area 55 of the ID-FET semiconductor device during diode operation.

Figure 3:
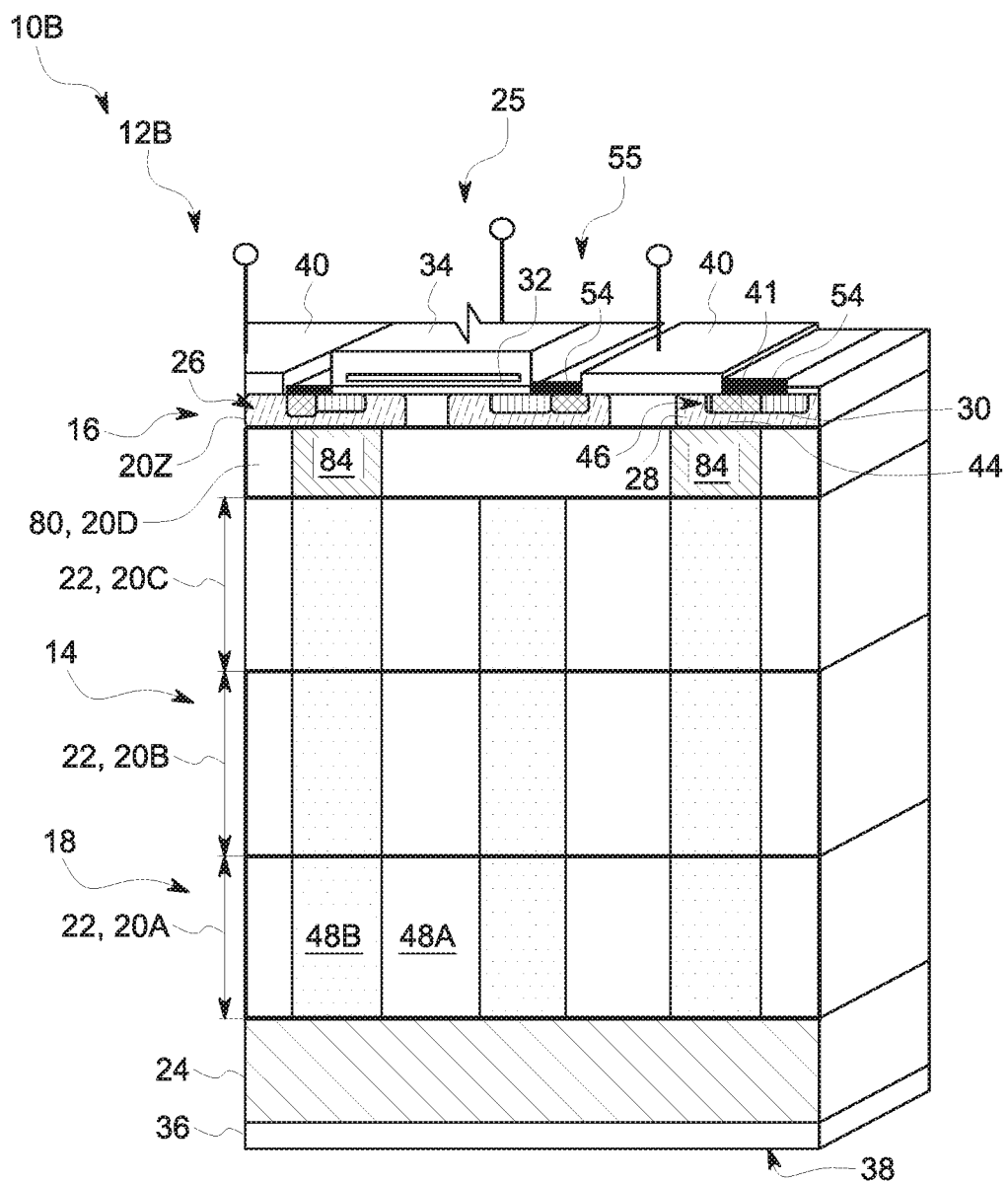
FIG. 3 is a cross-sectional view of an additional SJ semiconductor device that includes a diode integrated with a FET, as well as a current spreading layer, in accordance with an embodiment.

In some embodiments, to improve layout efficiency (e.g., area utilization, and/or the like) and/or performance of the ID-FET semiconductor device 10, a second embodiment of the ID-FET semiconductor device 10B may include a current spreading layer 80, as shown in FIG. 3. In some embodiments the current spreading layer 80 may be formed as an epi layer 20D interleaved between the device epi layer 20Z and an underlying epi layer 20C. Moreover, a set of connection regions 84 (e.g., bus regions and/or "plugs") having the second conductivity type (e.g., p-type connection regions) may be implanted intermittently into the current spreading layer 80 to electrically couple at least a subset and/or portion of the second set of SJ pillars 48B to device features having the same conductivity type, such as the well region 28. With the current spreading layer 80, the FET area 25 and the diode area 55 of the SJID-FET device 12B may share conductivity paths (e.g., current flow paths), as current may flow through the current spreading layer 80 into one or more of the first set of SJ pillars 48A previously blocked by one or more of the second set of SJ pillars 48B, as illustrated in FIG. 1. Accordingly, the ID-FET semiconductor device 10B may benefit from increased channel density. However, in some embodiments, the fabrication of the ID-FET semiconductor device 10B may be complex and/or resource (e.g., in terms of time, materials, and/or the like) intensive, as forming the current spreading layer 80 may involve one or more additional epi growth steps and/or implanting the connection regions 84 may use one or more implantation steps in addition to the steps involved with implanting the SJ pillars 48.

Figure 4:
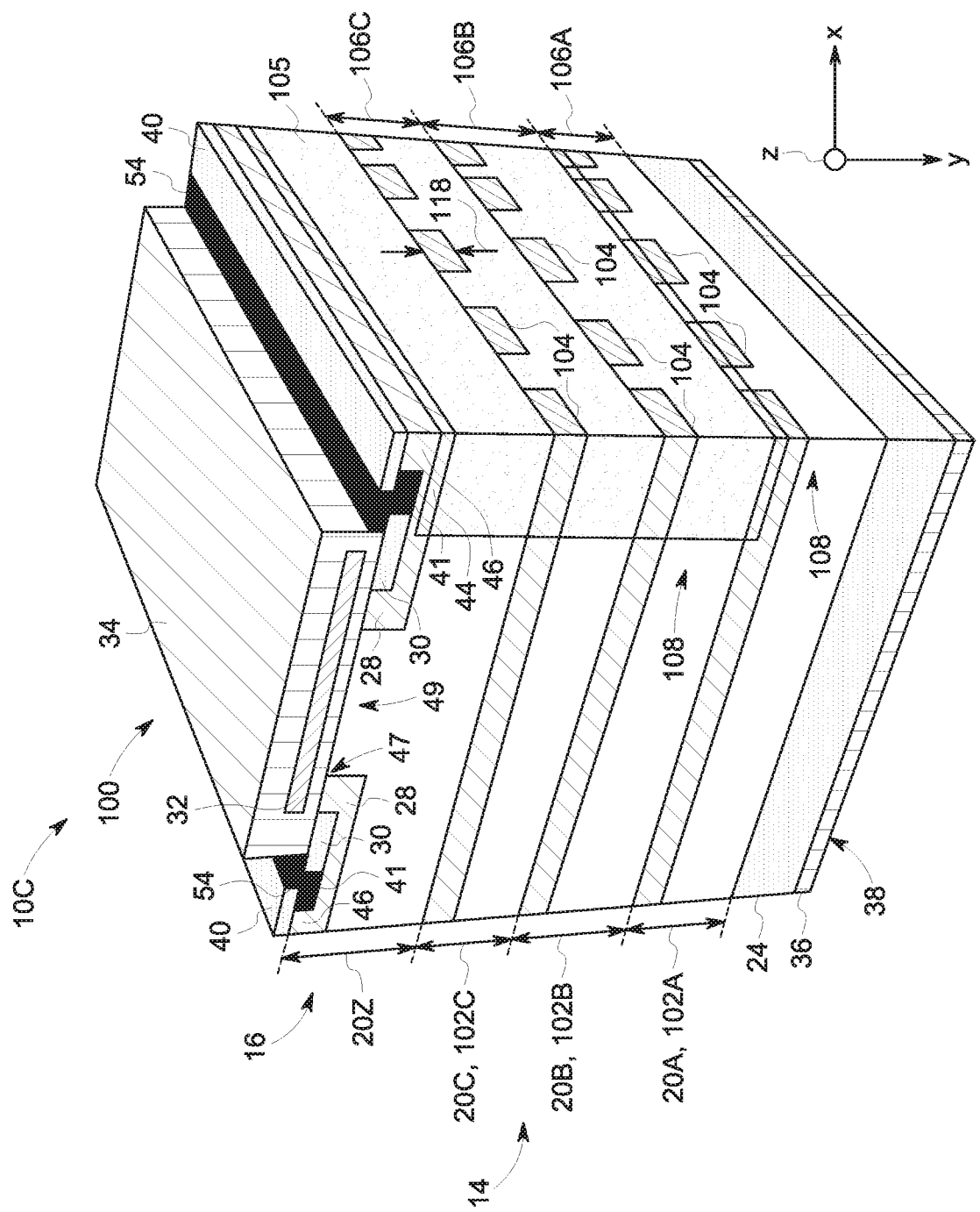
FIG. 4 is a perspective view of a charge balance (CB) semiconductor device that includes a diode integrated with a FET, as well as a CB region having a plurality of implanted CB regions, in accordance with an embodiment.

Turning now to FIG. 4, a third embodiment of an ID-FET semiconductor device 10C, namely a CB integrated diode field-effect transistor (CBID-FET) device 100, is illustrated. While the illustrated embodiment of the CBID-FET device 100 is demonstrates a diode integrated with a metal-oxide semiconductor field-effect transistor (MOSFET), it should be appreciated that the diode may be integrated with any suitable FET device, such as a junction field-effect transistor (JFET), a metal-semiconductor field-effect transistors (MESFETs), and/or FETs useful for medium-voltage (e.g., 3 kV-10 kV), such as 3.3 kV-6.5 kV, and/or high-voltage (e.g., greater than 10 kV) power conversion related applications.

The illustrated CBID-FET device 100 includes several device features (e.g., epi layers 20, gate electrode 34, source contact 40, drain contact 36, Schottky contact 54, well region 28, source region 30, and the like) illustrated and discussed above with reference to FIG. 1. Further, the drift region 14 of the illustrated CBID-FET device 100 includes CB layers 102 (e.g., 102A, 102B, 102C) implanted into the epi layers 20A, 20B, and 20C respectively, that each include a plurality of implanted CB regions 104. Additionally, the CBID-FET device 100 includes a charge balance (CB) bus 105 electrically coupled to at least a portion of the CB regions 104. Within the CB layers 102, the CB regions 104 are oppositely doped relative to the remainder 108 of the epi layers 20. In other words, for CBID-FET devices 100 having n-type CB layers 102 (e.g., n-type SiC epitaxial layers 20), the CB regions 104 are p-type, and for CBID-FET devices 100 having p-type epi layers 20, the CB regions 104 are n-type. Further, the dopant concentration in the set of CB regions 104A of the CB layer 102A may be the same or different as the dopant concentration in the set of CB regions 104B of the CB layer 102B and/or may be the same or different as the dopant concentration in the set of CB regions 104C of the CB layer 102C, in certain embodiments. Moreover, the CB regions 104 and the remainder 108 of the epi layers 20A, 20B, and 20C are each generally designed to substantially deplete and to generally provide similar amounts (e.g., substantially equal amounts) of effective charge (e.g., per $cm^2$, normalized to device active area) from ionized dopants under reverse bias. The illustrated charge balance structure allows the CBID-FET device 100 to achieve high breakdown voltage and low on-state resistance, since the p-type semiconductor portions and the n-type semiconductor portions are both substantially depleted under nominal blocking conditions.

In some embodiments, the disclosed CB regions 104 and CB layers 102 may have one or more properties (e.g., doping, width, depth, spacing, etc.), as described for floating charge-balance regions in U.S. Pat. No. 9,735,237, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes. For example, in some embodiments, the thicknesses 106A and 106Z of each of the epi layers 20A and 20Z is between 5 μm and 20 μm, such as between 10 μm and 12 μm. Additionally, the thickness 118 of the CB regions 104 is in the range of 0.5 μm to 1.0 μm. For such embodiments, the dopant concentration of the CB regions 104 may be between $2 \times 10^{16}$ per centimeters cubed ($cm^{-3}$) and $1 \times 10^{18}$ $cm^{-3}$. More specifically, in some embodiments, because the CB regions 104 may be implanted with a variable distribution of dopant concentrations, the CB regions 104 may be described as having an integrated charge (e.g., dose) of approximately $2 \times 10^{13}$ per square centimeter ($cm^{-2}$) (e.g., +/−20% and/or +/−50%). The integrated charge may be determined and/or adjusted based in part on the depth at which the CB regions 104 are implanted and/or the implant acceleration energy used to implant the CB regions 104. In such embodiments, the epi layers 20 may be doped to a doping concentration greater than or equal to $5 \times 10^{15}$ $cm^{-3}$, which may yield a device having a particular on resistance (e.g., less than 7 milliohms per square centimeter (mOhm/$cm^2$) and a particular breakdown voltage (e.g., greater than 3 kV, greater than 4.5 kV). In some embodiments, the doping concentration of the set of CB regions 104 divided by the thickness 118 of the CB regions 104 may be greater than or equal to $5 \times 10^{12}$ $cm^{-2}$ and less than or equal to approximately $1 \times 10^{14}$ $cm^{-2}$. Accordingly, in such embodiments, the set of CB regions 104 may have a doping concentration between $5 \times 10^{16}$ $cm^{-3}$ and $2 \times 10^{18}$ $cm^{-3}$. Moreover, in some embodiments, the CBID-FET device 100 may include fewer or additional CB layers 102 (e.g., one CB layer 102, two CB layers 102, four CB layers 102, and/or the like) to achieve a desired voltage rating, for example. Further, by fabricating the ID-FET semiconductor device 10C with CB layers 102, the area consumed by the ID-FET semiconductor device 10C may be reduced in comparison with an implementation of a separate (e.g., discrete) diode device and a separate FET device and providing similar performance (e.g. conduction losses, blocking voltage).

Figure 5:
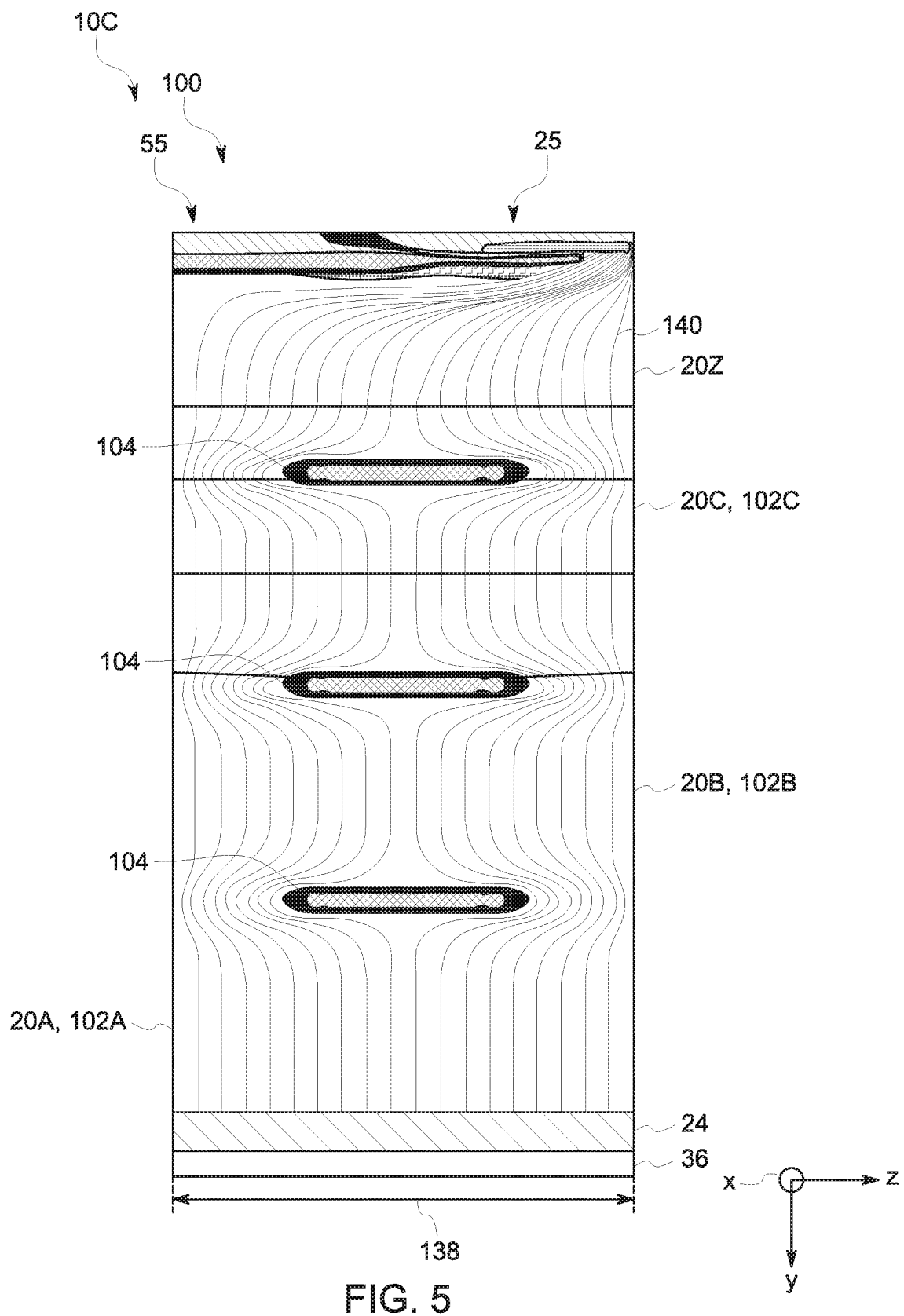
FIG. 5 is a schematic illustrating the drift region of the CB semiconductor device of FIG. 4, including equal current flow lines demonstrating a conduction path during FET operation of the CB semiconductor device, in accordance with an embodiment.

To help illustrate the integration of the FET area 25 and the diode area 55 in the ID-FET semiconductor device 10C, FIG. 5 illustrates a cross-sectional view of an example embodiment of the ID-FET semiconductor device 10C having a cell pitch greater than or equal to 5 μm and less than or equal to 10 μm. It may be appreciated that the width 138 of the cross-sectional view illustrated in FIG. 5 represents half the cell pitch of the ID-FET semiconductor device 10C. Additionally, FIG. 5 includes current flow lines 140 that indicate the conduction path of current while the ID-FET semiconductor device 10C operates during FET conduction. It may be noted that the current is represented as being higher (e.g., greater) when the flow lines 140 are close to one another and lower when there is larger spacing between the flow lines 140.

Figure 6:
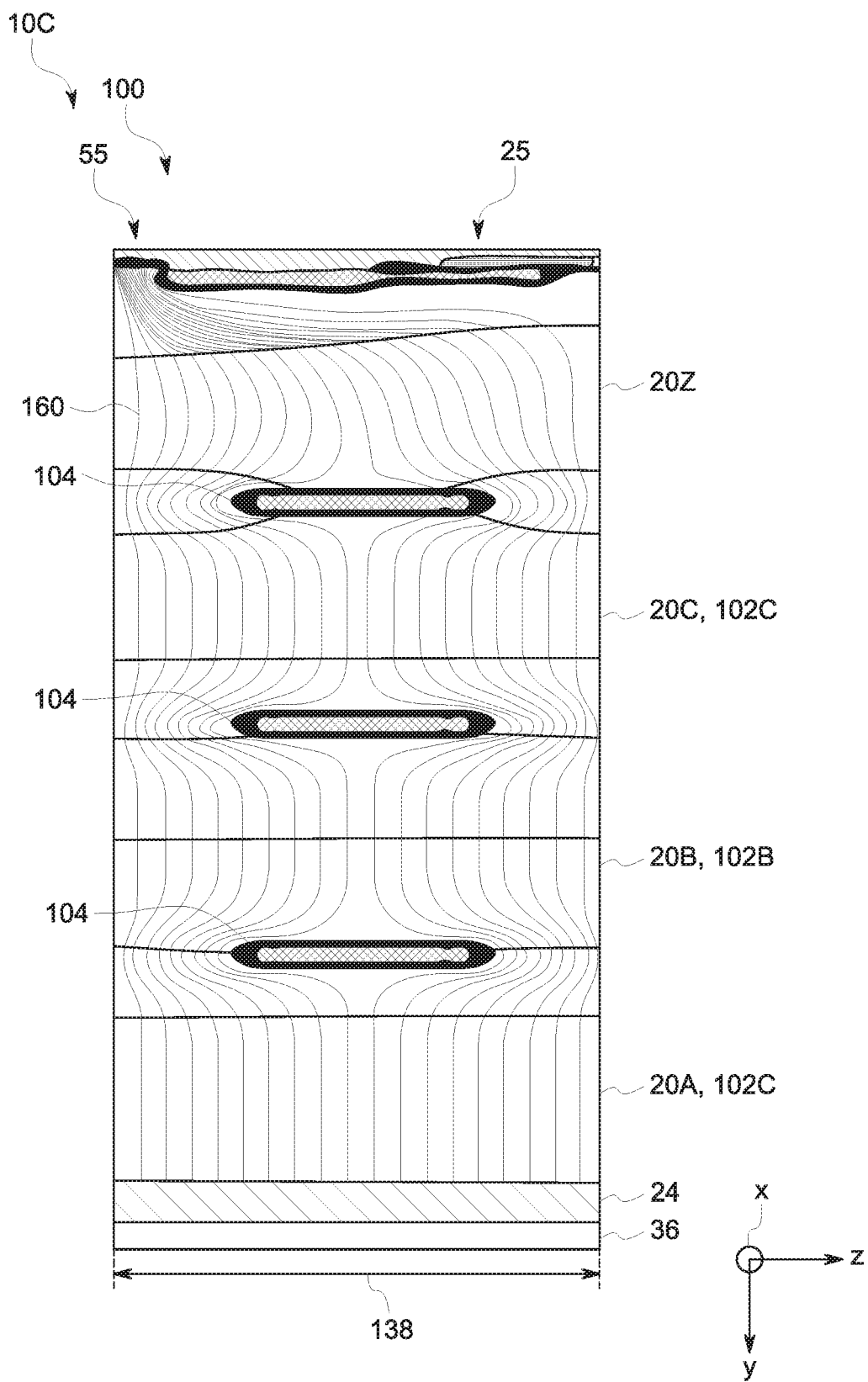
FIG. 6 is a schematic illustrating the drift region of the CB semiconductor device of FIG. 4, including equal current flow lines demonstrating a conduction path during diode operation of the CB semiconductor device, in accordance with an embodiment.

FIG. 6 also illustrates the cross-sectional view of the ID-FET semiconductor device 10C having a cell pitch greater than or equal to 5 μm and less than or equal to 10 μm. As described above, it may be appreciated that the width 138 of the cross-sectional view illustrated in FIG. 6 represents half the cell pitch of the ID-FET semiconductor device 10C. Additionally, FIG. 6 includes current flow lines 160 that indicate the conduction path of current while diode conduction of the ID-FET semiconductor device 10C. It may be noted that the current is represented as being higher (e.g., greater) when the flow lines 160 are close to one another and lower when there is larger spacing between the flow lines 160.

With reference now to FIGS. 5 and 6, it is presently recognized that current (e.g., flow lines 140 and flow lines 160) spreads throughout the same portion of the drift region 14 for both the FET and diode conduction. More specifically, FIGS. 5 and 6 illustrate that the FET area 25 and diode area 55 of the ID-FET semiconductor device 10C share a common conduction path. That is, for example, the FET area 25 and diode area 55 are integrated together in the ID-FET semiconductor device 10C. While the FET area 25 and the diode area 55 of the ID-FET semiconductor device 10C share a conduction path, for some device operating conditions, current flows in an opposite direction during FET conduction compared to diode conduction.

Figure 7:
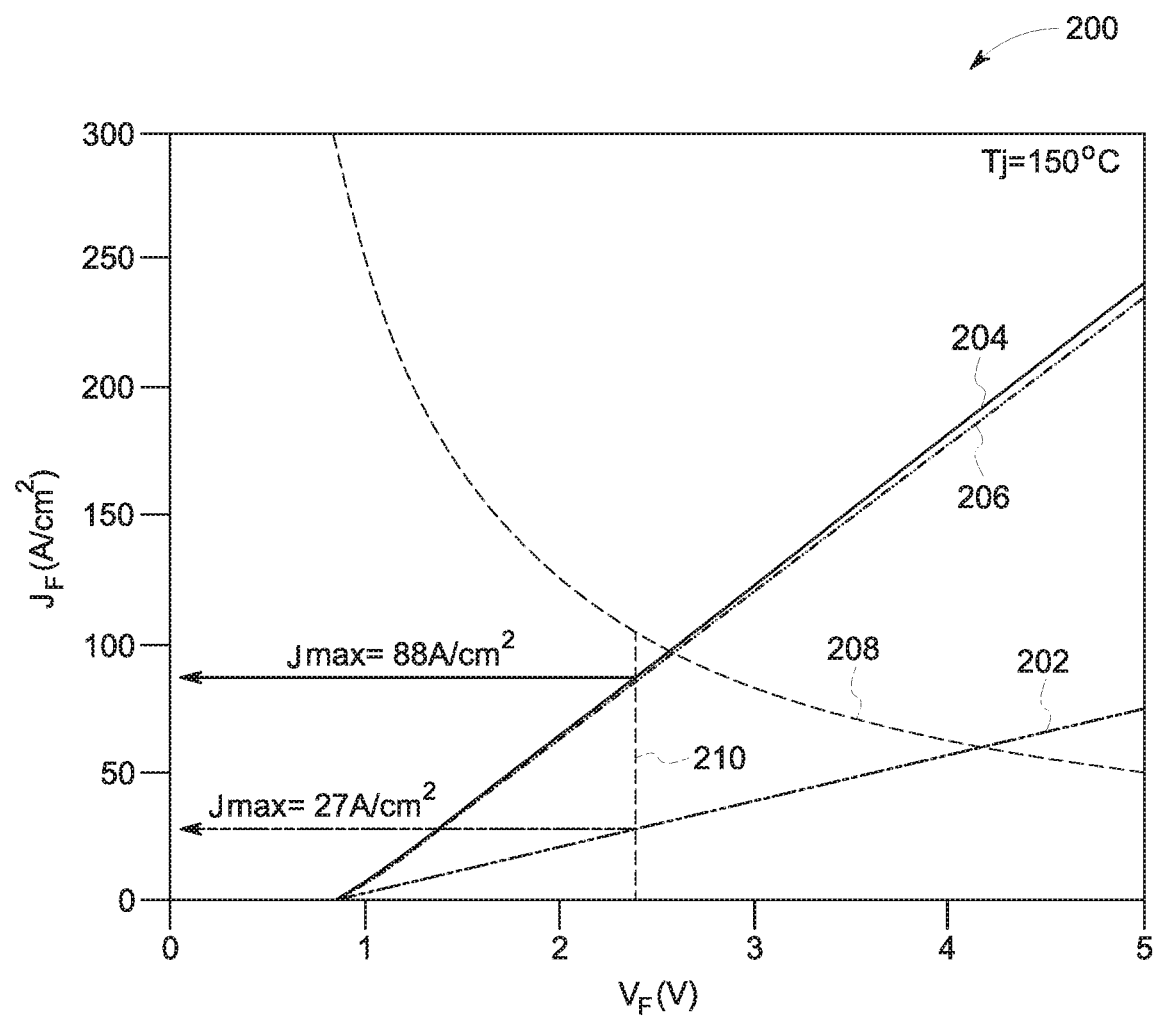
FIG. 7 is a graph illustrating an example of current-voltage (I-V) characteristics of a set of diode devices, in accordance with an embodiment.

Turning now to FIG. 7, graph 200 plots an example of current-voltage (I-V) characteristics of a 4.5 kilovolt (kV) rated discrete silicon carbide (SiC) junction barrier Schottky (JBS) diode device, a 4.5 kV discrete charge balance (CB) diode device, and a 4.5 keV embodiment of the CBID-FET device 100 of FIG. 4 each operating at junction temperature ($T_j$) (e.g., transistor junction temperature) of 150 degrees Celsius (° C.). The graph 200 includes each of a first curve 202 corresponding to the discrete JBS diode device, a second curve 204 corresponding to the discrete CB diode device, and a third curve corresponding to the CBID-FET device 100 plotted for current density (J) in amperes per square centimeter (A/$cm^2$) as a function of cathode voltage ($V_C$) in volts (V). The graph 200 further includes a power curve 208 that plots the practical power limit of 250 W/$cm^2$ against the current density and cathode voltage axes. Additionally, the graph 200 includes a line 210 that denotes the built-in potential (e.g., 2.4V) of the SiC p-n junction (e.g., internal and/or intrinsic body diode of a SiC MOSFET device.

As illustrated by the first curve 202, to maintain a forward voltage drop below the turn-on voltage (e.g., the built-in potential) of the internal body diode (e.g., to suppress bipolar conduction of the internal body diode), the discrete conventional planar JBS diode device may operate with a current density less than or equal to 27 A/cm². Meanwhile, the second curve 204 demonstrates that the discrete CB diode device operates with a current density less than or equal to 88 A/cm² (e.g., over 3 times the operational current density of the discrete JBS diode device) while suppressing the bipolar conduction mode of the internal body diode. Moreover, the third curve 206 illustrates that the CBID-FET device 100 suppresses the bipolar conduction mode of the integral body diode while operating across approximately the same current density range as the CB diode device (e.g., up to 88 A/cm²). That is, the CBID-FET device 100 represented in FIG. 7 suppresses the body diode conduction across the nominal operating range of the CBID-FET device 100.

Further, it may be appreciated that the slope of each of the first curve 202, the second curve 204, and the third curve 206 is representative of the specific on-resistance of the respective device corresponding to the curve. Accordingly, as discussed above and illustrated by the first curve 202 and second curve 204, by including CB layers 102 in a semiconductor device (e.g., a diode), the specific on-resistance of the device is reduced. That is, for example, the specific on-resistance of the discrete CB diode device (corresponding to the second curve 204) is less than the specific on-resistance of the discrete JBS diode device (corresponding to the first curve 202). However, as further illustrated by the graph 200, integrating a FET into the discrete CB diode device (e.g., to yield a CBID-FET device 100) may result in an increase of specific on-resistance. Accordingly, the slope of the third curve 206 is less than the slope of the second curve 204. In some embodiments, however, the difference in specific on-resistance between the discrete CB diode and the CBID-FET device 100 may be relatively small (e.g., on the order of 3%), as shown in the illustrated embodiment.

Figure 8:
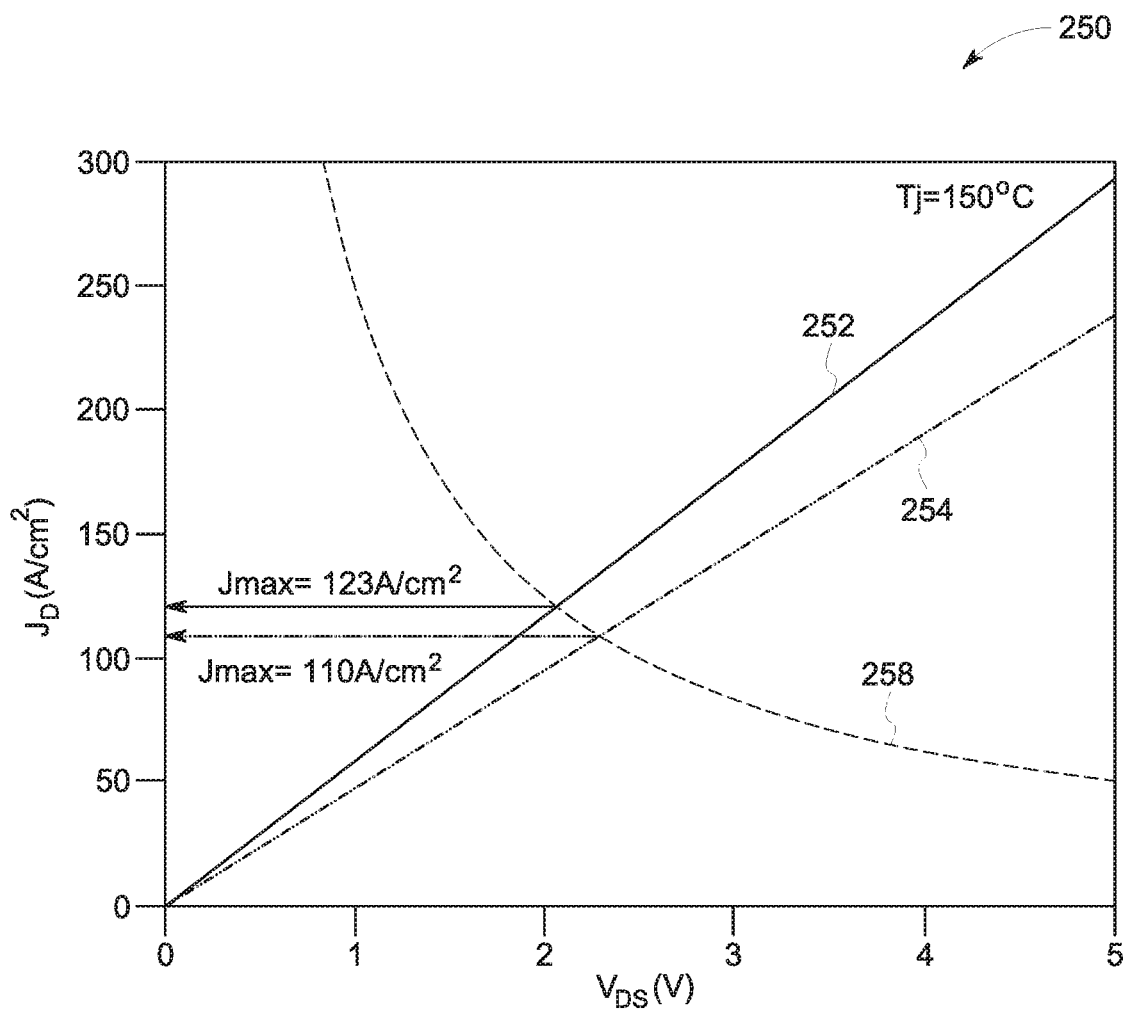
FIG. 8 is a graph illustrating an example of I-V characteristics of a set of FET devices, in accordance with an embodiment.

Turning now to FIG. 8, graph 250 plots an example of current-voltage (I-V) characteristics of a 4.5 kilovolt (kV) discrete charge balance (CB) metal oxide semiconductor field-effect transistor (MOSFET) device and a 4.5 kV embodiment of the CBID-FET device 100 illustrated in FIG. 4, such as a CBID-MOSFET device, operating at a junction temperature ($T_j$) (e.g., transistor junction temperature) of 150 degrees Celsius (° C.). The graph 250 includes each of a first curve 252 corresponding to the discrete CB MOSFET device and a second curve 254 corresponding to the CBID-FET device 100 plotted for current density (J) in amperes per square centimeter (A/cm²) as a function of the voltage difference between the drain contact 36 and source contact 40 ($V_{DS}$) in volts (V). The graph 250 further includes a power curve 258 that plots the practical power limit of 250 W/cm² against the current density and $V_{DS}$ axes.

As discussed with reference to FIG. 7, it may be appreciated that the slope of each of the first curve 252 and the second curve 254 is representative of the specific on-resistance of the respective device corresponding to the curve. Accordingly, it can be seen that integrating a diode into the discrete CB MOSFET device (e.g., to yield a CBID-FET device 100) may result in an increase of specific on-resistance. That is, for example, the slope of the second curve 254 is less (e.g., by about 25%) than the slope of the first curve 252. In some embodiments, the increased specific on-resistance may result from an increase in cell pitch (e.g., width) of the CBID-FET device 100 compared to the CB MOSFET device that is used to accommodate the integrated diode. As a result, the maximum current density of the CBID-FET device 100 is lower than the maximum current density of the discrete CB MOSFET device. For example, as illustrated, the first curve 252 intersects the power curve 258 at a current density of about 123 A/cm², while the second curve 254 intersects the power curve 258 at a current density of about 110 A/cm² (e.g., approximately 10% less than the maximum current density of the first curve 252).

Accordingly, with reference now to FIGS. 7 and 8, it may be appreciated that the CBID-FET device 100 may include certain performance differences in comparison with its discrete device counterparts (e.g., a discrete CB diode device and/or a discrete CB-FET device). For instance, the specific on-resistance of the CBID-FET device 100 may be greater than the respective specific on-resistance of each of the discrete CB diode device and/or the discrete CB-FET device, as discussed above. Moreover, the maximum operating current density of the CBID-FET device 100 may be lower than the respective maximum operating current density of each of the discrete CB diode device and/or the discrete CB-FET device. Further, the cell pitch (e.g., width) of the CBID-FET device may be greater than the respective width of the discrete CB diode and/or the discrete CB-FET device.

However, the CBID-FET device 100 may be implemented with an active area that is less than half the active area of the total active area consumed by a discrete CB MOSFET device and a discrete CB diode device. Accordingly, because the CBID-FET device 100 may operate with characteristics similar to a discrete diode and a discrete CB MOSFET device, integrating a diode and a FET into the CBID-FET device 100 may eliminate the need to use separate diode die in high power modules (e.g., high power FET devices). As such, the CBID-FET device 100 may benefit from reduced area and improved suppression of internal body diode conduction compared to discrete device designs (e.g., a discrete CB-MOSFET device and a discrete diode device).

Moreover, in some embodiments, the ratio of the FET area 25, which may correspond to area occupied by the gate electrode 34 and/or the source contact 40, to the diode area 55, which may correspond to the area occupied by the Schottky contact 54, of the CBID-FET device 100 may be selected (e.g., selected as a 1:1 ratio, selected as between a 1:4 ratio and a 4:1 ratio, and/or the like) to adjust certain performance characteristics of the CBID-FET device 100. For example, the characteristics plotted in FIGS. 7 and 8 for embodiments of the CBID-FET device 100 may correspond to a first CBID-FET device 100 having a 1:1 ratio of FET area 25 to diode area 55. However, a second CBID-FET device 100 having greater FET area 25 than diode area 55 may behave more similarly to a discrete CB-MOSFET device than the first CBID-FET device 100, which includes equal FET and diode areas. Accordingly, relative to the first CBID-FET device 100, the difference between the maximum current density of the second CBID-FET device 100 and the discrete CB-MOSFET device may be reduced, the difference between the specific on-resistance of the second CBID-FET device 100 and the discrete CB-MOSFET device may be reduced, and/or the like. Further, relative to the first CBID-FET device 100, the difference between the maximum current density of the second CBID-FET device 100 and the discrete CB diode device may be increased, the difference between the specific on-resistance of the second CBID-FET device 100 and the discrete CB diode device may be increased, and/or the like.

Moreover, a third CBID-FET device 100 having a lower ratio of FET area 25 to diode area 55 may behave more similarly to a discrete CB diode device than the first CBID-FET device 100. Accordingly, relative to the first CBID-FET device, the difference between the maximum current density of the third CBID-FET device 100 and the discrete CB-MOSFET device may be increased, the difference between the specific on-resistance of the third CBID-FET device 100 and the discrete CB-MOSFET device may be increased, the difference between the maximum current density of the third CBID-FET device 100 and the discrete CB diode device may be reduced, the difference between the specific on-resistance of the third CBID-FET device 100 and the discrete CB diode device may be reduced, and/or the like. Accordingly, embodiments described herein are intended to be illustrative and not limiting.

Figure 9:
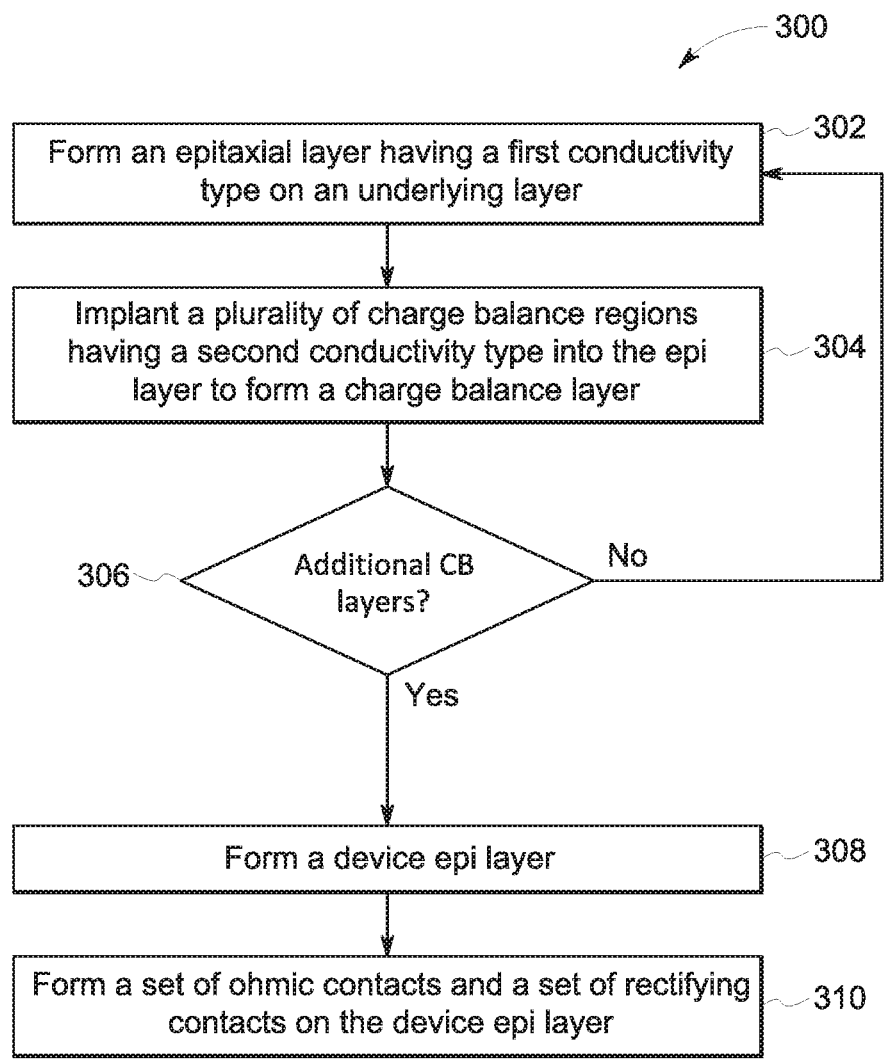
FIG. 9 is a flow chart of a process for manufacturing a CB integrated diode field-effect transistor (CBID-FET) device, in accordance with an embodiment.

FIG. 9, is a flow chart of a process 300 for manufacturing an embodiment of the CBID-FET device 100, in accordance with embodiments described herein. Although the following description of the process 300 is described in a particular order, which represents a particular embodiment, it should be noted that the process 300 may be performed in any suitable order. Further, certain steps may be repeated or skipped altogether, and additional steps may be included in the process 300 in other embodiments. The following description of the process 300 is described with reference to embodiments of the CBID-FET device 100 illustrated in FIG. 4.

The illustrated process 300 begins with forming (block 302) an epi layer 20 on an underlying layer. In some embodiments, the underlying layer may include the semiconductor substrate layer 24. As described above, the substrate layer 24 may be made of silicon, silicon carbide (SiC), gallium nitride, diamond, aluminum nitride, and/or boron nitride. Alternatively, the epi layer may be formed on another epi layer 20 and/or a CB layer 102, as described in greater detail below.

To form the first epi layer 20A on the underlying layer, the epi layer 20A may be grown using chemical vapor deposition (CVD). However, in some embodiments, the epi layer 20A may be grown onto the underlying layer using any suitable technique. The epi layer 20A may be formed from one or more wide-bandgap semiconductor materials, such as silicon carbide, gallium nitride, diamond, aluminum nitride, and/or boron nitride. Further, as discussed above, the epi layer 20A may have a first conductivity type (e.g., n-type) and a low dopant concentration (e.g., epi doping) relative to other regions of the CBID-FET device 100 (e.g., the CB regions 104, the well region 28, the source region 30, and/or the like).

After the epi layer 20 is formed on the underlying layer, the illustrated process 300 proceeds with a set of CB regions 104 having the second conductivity type being implanted (block 304) into the epi layer 20A to form a CB layer 102A. Each of the set of CB regions 104 may have a doping concentration less than or equal to $1 \times 10^{18}$ cm$^{-3}$ and/or greater than or equal to $2 \times 10^{16}$ cm$^{-3}$, as described above. More specifically, in some embodiments, because the each of the set of CB regions 104 may be implanted with a variable distribution of dopant concentrations, the CB regions 104 may be described as having an integrated charge (e.g., dose) of approximately $2 \times 10^{13}$ cm$^{-2}$ (e.g., +/−20% and/or +/−50%). The integrated charge may be determined and/or adjusted based in part on the depth at which the set of CB regions 104 are implanted and/or the implant acceleration energy used to implant the set of CB regions 104. Further, the set of CB regions 104 may be implanted according to any suitable means (e.g., high energy implant, lower energy implant). For example, in some embodiments, prior to implanting the set of CB regions 104, a mask may be formed on at least a portion of the epi layer 20A. The mask may be formed from silicon oxide, silicon nitride, polycrystalline silicon, silicon, a metal layer, an organic resist layer, or a suitable combination thereof. Moreover, the mask may be formed using any suitable means. That is, for example, the mask may be deposited, grown, and/or coated directly onto the portion of the epi layer 20A. Furthermore, once the mask material has been deposited on the surface of the epi layer 20A, the mask may be formed by patterning (e.g., lithographically patterning) the mask material to expose or uncover a portion of the epi layer 20A. The set of CB regions 104 may then be selectively implanted through the exposed portion of the epi layer 20A, and the mask may then be removed.

In some embodiments, the set of CB regions 104 may be implanted with standard low energy implantation techniques. For example, the set of CB regions 104 may be implanted to a depth less than or equal to 1 μm. Accordingly, an implantation energy less than 500 keV may be used to implant each of the CB regions 104. However, in some embodiments, the set of CB regions 104 may be implanted according to a suitable high energy ion implantation technique. Accordingly, an implantation energy greater than 500 keV and/or less than 50 MeV may be used to implant each of the CB regions 104. Accordingly, the mask described above may be a high energy implantation mask (e.g., silicon on insulator (SOI), polysilicon, thick silicon oxide, high-Z metals such as platinum, molybdenum, gold) used in conjunction with the high energy ion implantation.

After implanting the CB layer 102A into the epi layer 20A, to construct the CBID-FET device 100 with additional CB layers 102 (e.g., 102B, 102C) (decision block 306), a first portion (e.g., block 302 and block 304) of the illustrated process 300 may be repeated any suitable number of times. For example, the illustrated embodiment of the CBID-FET device 100 of FIG. 4 includes three CB layers 102 (e.g., 102A, 102B, 102C). Accordingly, in such embodiments, an additional epi layer 20B may be formed (block 302) on the implanted CB layer 102A, and an additional CB layer 102B may be implanted (block 304) into the additional epi layer 20B.

After forming each of the CB layers 102, the illustrated embodiment of the process 300 proceeds with forming (block 308) a device epi layer 20Z on the top CB layer 102C (e.g., the most recently implanted CB layer 102C). As described above with reference to block 302, the device epi layer 20Z may be formed according to any suitable techniques (e.g., CVD). The device epi layer 20Z may be formed from one or more wide-bandgap semiconductor materials, such as silicon carbide, gallium nitride, diamond, aluminum nitride, and/or boron nitride. Further, as discussed above, the device epi layer 20Z may have a first conductivity type and a certain low dopant concentration relative to other regions of the CBID-FET device 100 (e.g., the CB regions 104, the well region 28, the source region 30, and/or the like). In some embodiments, the device epi layer 20Z may have the same dopant concentration as the one or more epi layers 20 (e.g. 20A, 20B, and/or 20C) formed previously (e.g., at block 302). Further, in some embodiments, other processing and/or implantation steps may be performed to form other features (e.g., the well region 28, source region 30, and/or the like) in the device epi layer 20Z to yield the device layer 16.

Subsequently, the illustrated process 300 proceeds by forming (block 310) a set of ohmic contacts (e.g., electrodes) and a set of rectifying contacts on the device layer 16. The set of ohmic contacts may include the source contact 40 and the drain contact 36. Accordingly, forming the set of ohmic contacts may define at least a portion of the FET area 25 of the CBID-FET device 100. Further, the set of rectifying contacts may include the Schottky contact 54. As such, forming the set of rectifying contacts may define at least a portion of the diode area 55 of the CBID-FET device 100.

In some embodiments, the set of rectifying contacts may be made from nickel (Ni), tungsten (W), titanium (Ti), or combination thereof. Additionally or alternatively, the set of rectifying contacts may be formed from the same materials (e.g., metal and/or polysilicon) as the set of ohmic contacts. In such embodiments, however, the set of rectifying contacts can undergo different processing steps than the set of ohmic contacts. For instance, each of the set of ohmic contacts and the set of rectifying contacts may be formed using a particular metal. More specifically, to form the set of ohmic contacts, after depositing and/or forming the metal on the device layer 16, the metal may undergo cleaning and/or treatment (e.g., thermal annealing). Meanwhile, the metal may be deposited separately (e.g., in a separate processing step) and/or the cleaning and/or treatment may vary or be omitted to form the set of rectifying contacts. Moreover, the set of rectifying contacts may be used to form a junction barrier Schottky (JBS) diode, a merged PiN Schottky (MPS) diode, and/or other diodes that may be useful for medium-voltage (e.g., 3 kV-10 kV) and high-voltage (e.g., greater than 10 kV) power conversion related applications, as discussed above. Accordingly, in some embodiments, forming the set of rectifying contacts may involve forming the set of rectifying contacts above and in electrical contact with one or more of a set of JBS regions 58 implanted in the device epi layer 20Z.

Technical effects of the invention include designs and methods of manufacturing ID-FET devices, such as CBID-FET devices, that may eliminate the use of separate diode chips in high power modules (e.g., high power FET devices). In particular, the disclosed CBID-FET devices include a diode, such as a Schottky diode, integrated with a FET, such as a MOSFET. Accordingly, the CBID-FET benefits from reduced area and improved suppression of conduction of the internal body diode intrinsic to the FET compared to a power module designed with the discrete device counterparts of the CBID-FET device (e.g., a discrete CB diode device, a discrete CB FET device). Moreover, the designs and method of manufacturing ID-FET devices offer flexibility and customizability, as the ratio of device area dedicated to the FET and/or the integrated diode may be adjusted in order to adjust certain performance characteristics of the ID-FET device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A silicon carbide (SiC) semiconductor device comprising:
   a charge balance (CB) layer defined in a first epitaxial (epi) layer having a first conductivity type, wherein the CB layer includes a plurality of CB regions having a second conductivity type;
   a device epi layer having the first conductivity type disposed on the CB layer, wherein the device epi layer comprises a plurality of regions having the second conductivity type;
   an ohmic contact disposed directly on the device epi layer, wherein a field-effect transistor (FET) of the SiC semiconductor device comprises the ohmic contact; and
   a rectifying contact disposed directly on the device epi layer, wherein a diode of the SiC semiconductor device comprises the rectifying contact, wherein the diode and the FET are integrated in parallel in the SiC semiconductor device.

2. The SiC semiconductor device of claim 1, wherein the rectifying contact comprises a Schottky contact.

3. The SiC semiconductor device of claim 1, wherein the ohmic contact comprises a source contact.

4. The SiC semiconductor device of claim 1, wherein a cell pitch of SiC semiconductor device is between 5 microns (μm) and 10 μm.

5. The SiC semiconductor device of claim 1, wherein the plurality of regions comprises a plurality of junction barrier Schottky (JBS) regions.

6. The SiC semiconductor device of claim 5, wherein the rectifying contact is disposed directly on a JBS region of the plurality of JBS regions.

7. The SiC semiconductor device of claim 1, wherein the FET comprises a metal-oxide semiconductor field-effect transistor (MOSFET), a junction field-effect transistor (JFET), a metal-semiconductor field-effect transistor (MESFET), or a combination thereof.

8. The SiC semiconductor device of claim 1, wherein the diode comprises a Schottky barrier diode, a junction barrier Schottky (JBS) diode, a merged Pin Schottky (MPS) diode, or a combination thereof.

9. The SiC semiconductor device of claim 1, wherein the SiC semiconductor device comprises a breakdown voltage between 3.3 kilovolts (kV) and 6.5 kV.

10. The SiC semiconductor device of claim 1, wherein a ratio of an area of the FET to an area of the diode is 1:1.

11. A method of manufacturing a silicon carbide (SiC) semiconductor device, comprising:
   forming a first epitaxial (epi) layer having a first conductivity type on an underlying layer, wherein the underlying layer is formed from wide-bandgap material;
   implanting a first plurality of charge balance (CB) regions having a second conductivity type into the first epi layer to yield a CB layer;
   forming a device epi layer having the first conductivity type on the CB layer, wherein the device epi layer comprises a plurality of regions having the second conductivity type; and
   forming an ohmic contact directly on the device epi layer, wherein a field-effect transistor (FET) of the SiC semiconductor device comprises the ohmic contact; and forming a rectifying contact directly on the device epi layer, wherein a diode of the SiC semiconductor device comprises the rectifying contact, wherein the diode and the FET are integrated in parallel in the SiC semiconductor device.

12. The method of claim 11, comprising implanting a CB bus region having the second conductivity type to extend between and electrically couple a CB region of the first plurality of CB regions of the CB layer to at least one of the plurality of regions.

13. The method of claim 11, wherein forming the ohmic contact and forming the rectifying contact comprises depositing a material on the device epi layer, and, wherein after depositing the material, forming the ohmic contact comprises thermally annealing the material.

14. The method of claim 11, comprising:
forming a current spreading layer having the first conductivity type on the CB layer; and
implanting a plurality of connection regions having the second conductivity type into the current spreading layer to extend between and electrically couple a CB region of the first plurality of CB regions of the CB layer to at least one of the plurality of regions, wherein the CB region of the first plurality of CB regions comprises a super-junction (SJ) pillar, and wherein the CB layer comprises a SJ layer.

15. A silicon carbide (SiC) semiconductor device comprising:
a charge balance (CB) layer defined in a first epitaxial (epi) layer having a first conductivity type, wherein the CB layer includes a plurality of CB regions having a second conductivity type;
a device epi layer having the first conductivity type disposed on the CB layer, wherein the device epi layer includes a plurality of junction barrier Schottky (JBS) regions having the second conductivity type;
an ohmic contact disposed on the device epi layer, wherein a field-effect transistor (FET) of the SiC semiconductor device comprises the ohmic contact; and
a rectifying contact disposed on the device epi layer, wherein the rectifying contact is disposed on a JBS region of the plurality of JBS regions, wherein a diode of the SiC semiconductor device comprises the rectifying contact, wherein the diode and the FET are integrated in parallel in the SiC semiconductor device.

16. The SiC semiconductor device of claim 15, wherein a first area occupied by the ohmic contact is greater than or equal to a second area occupied by the rectifying contact.

17. The SiC semiconductor device of claim 15, comprising:
an additional CB layer defined within a second epi layer having the first conductivity type, wherein the additional CB layer includes an additional plurality of CB regions having the second conductivity type, and, wherein the first epi layer is disposed on the additional CB layer.

18. The SiC semiconductor device of claim 15, wherein the ohmic contact is disposed directly on the device epi layer and wherein the rectifying contact is disposed directly on the device epi layer.

19. The SiC semiconductor device of claim 15, comprising:
a current spreading layer having the first conductivity type disposed directly on the CB layer, wherein the device epi layer is disposed directly on the current spreading layer.

20. The SiC semiconductor device of claim 19, wherein, during operation of the FET, the FET comprises a first conduction path between a drain contact of the SiC semiconductor device and the ohmic contact via the current spreading layer, and wherein, during operation of the diode, the diode comprises a second conduction path between the rectifying contact and the drain contact via the current spreading layer, such that the first conduction path and the second conduction path at least partially overlap.

21. The SiC semiconductor device of claim 19, wherein the current spreading layer includes at least one bus region having the second conductivity type that extends between at least one of the plurality of CB regions of the CB layer and the JBS regions of the device epi layer.

* * * * *